United States Patent [19]

Nakamura et al.

[11] Patent Number: 5,144,389
[45] Date of Patent: Sep. 1, 1992

[54] INSULATED GATE FIELD EFFECT TRANSISTOR WITH HIGH BREAKDOWN VOLTAGE

[75] Inventors: Mitsuyoshi Nakamura; Kazuaki Miyata, both of Hyogo, Japan

[73] Assignee: Mitsubishi Denki Kabushiki Kaisha, Tokyo, Japan

[21] Appl. No.: 583,384

[22] Filed: Sep. 17, 1990

[30] Foreign Application Priority Data

Sep. 18, 1989 [JP] Japan ................ 1-241336

[51] Int. Cl.⁵ .............. H01L 29/10; H01L 29/68; H01L 29/74
[52] U.S. Cl. ...................... 357/23.4; 357/23.3; 357/23.8; 357/38
[58] Field of Search .......... 357/23.4, 23.3, 23.8, 357/38

[56] References Cited

U.S. PATENT DOCUMENTS 4,893,157  1/1990  Miyazawa et al. ........... 357/23.8
4,980,743 12/1990  Nakagawa et al. ........... 357/23.4

Primary Examiner—Rolf Hille
Assistant Examiner—Wael Fahmy
Attorney, Agent, or Firm—Lowe, Price, Le Blanc & Becker

[57] ABSTRACT

An MIS FET has an off-set gate structure in which a gate electrode and a drain region. The drain region is formed of an n type impurity region of a high concentration and has a pn junction region provided between the drain region and the p type silicon substrate. Further, n type impurity regions of the low concentration are in contact with a part of a peripheral portion of the n type impurity regions of the high concentration. The n type impurity regions of the low concentration alleviate the concentration of the electric field near the drain region to increase the drain breakdown voltage. The pn junction region of the n type impurity region of the high concentration and the p type silicon substrate increases a junction capacitance of the entire drain region, increases a surge current discharged to the substrate side from the drain region for the surge breakdown to increase the surge withstanding amount.

7 Claims, 12 Drawing Sheets

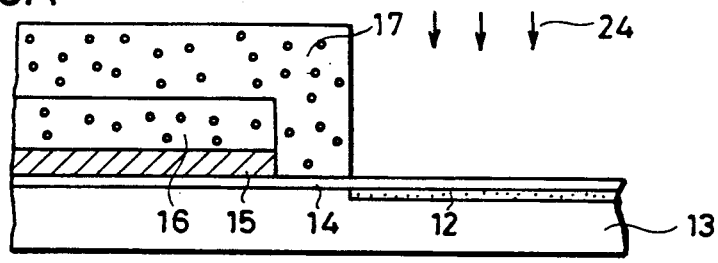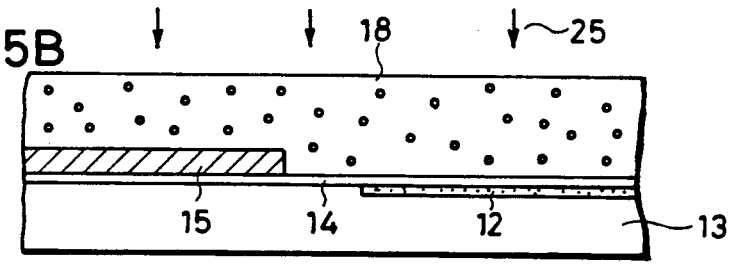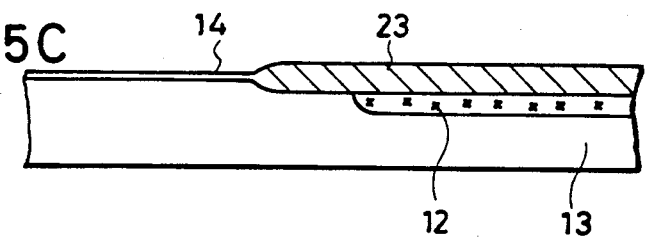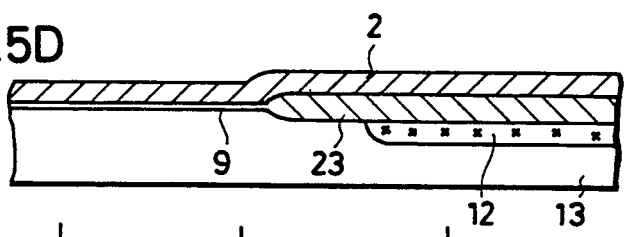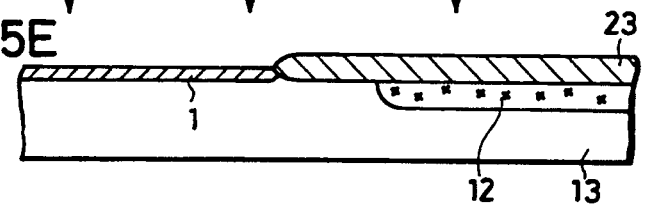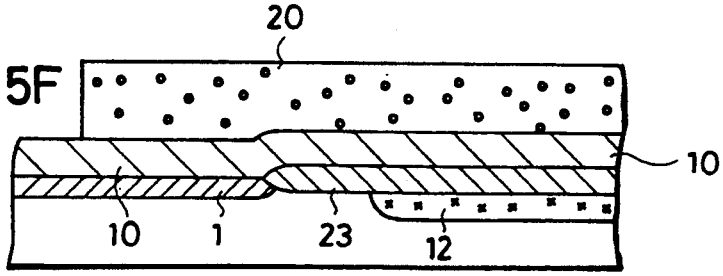

ns of the structure of the MIS FET with the high breakdown voltage shown in FIG. 8 in the steps of manufacturing the same and FIGS. 12A to 12H are sectional views of the structure shown in FIG. 9 in the manufacturing steps thereof.

INSULATED GATE FIELD EFFECT TRANSISTOR WITH HIGH BREAKDOWN VOLTAGE

BACKGROUND OF THE INVENTION

1. Field of the Invention

The present invention relates generally to semiconductor devices, and, more particularly, to a structure in which surge withstanding amount of an insulated gate field effect transistor with a high breakdown voltage (referred to as MIS FET with a high breakdown voltage hereinafter) can be increased. The present invention further relates to a method of manufacturing an MIS FET with a high breakdown voltage.

2. Description of the Background Art

FIG. 7 is a plan view of a semiconductor device comprising a conventional MIS FET (Metal Insulator Semiconductor Field Effect Transistor) with a high breakdown voltage. FIGS. 8 and 9A show diagrams of sectional structures taken along section lines VIII—VIII and IX—IX in FIG. 7. Referring to these FIGURES, a conventional MIS FET with a high breakdown voltage comprises a gate electrode 2 on a major surface of a p type silicon substrate 13 through a thin gate insulation film 9, and further comprises a pair of n+ regions; drain region 1 and source region 3 at the opposite sides of the gate electrode 2 on the surface of the p type silicon substrate 13. The n+ drain region 1 is surrounded by an n−− drain region 4 of a low concentration. A field oxide film 7 having a larger film thickness than that of the gate insulation film 9 is formed between the n−− drain region 4 and the gate electrode 2. An n− source region 6 of the low concentration is formed at an end portion on a channel side of the n+ source region 3. A double structure of the n+ source region 3 and the n− source region 6 constitutes a so-called LDD (Lightly Doped Drain) structure. Gate sidewalls 8 are formed on sidewalls of the gate electrode 2 and the LDD structure in the source region is formed by using the gate sidewall 8. An interlayer insulating film 10 is formed on the major surface of the p type silicon substrate 13. An aluminum interconnection layer 5 is connected to the n+ drain region 1 and the n+ source region 3 through a contact hole 22 formed in each interlayer insulating film 10. A surface of the interlayer insulating film 10 and the like is covered with a passivation film 11. Each of the MIS FETs formed on the surface of the p type silicon substrate 13 is insulated and isolated through a field isolation oxide film 23. A p+ channel stopper 12 is formed under the field isolation oxide film 23.

In the above described MIS FET, a part of the gate insulation film is formed of the thick field oxide film 7. Such a structure is directed to the increase of a breakdown voltage between a source and a drain, because the formation of the thick oxide film 7 alleviates an electric field near the drain region. In addition, the n−− drain region 4 having a lower concentration than that of the n+ drain region 1 is formed around the n+ drain region 1. Formation of the n−− drain region 4 of the low concentration allows a depletion layer to expand toward the drain side, thereby alleviating concentration of the electric field near the drain. This alleviates the electric field between the source and the drain to increase a breakdown voltage between the source and the drain.

Steps of manufacturing the above described MIS FET with the high breakdown voltage will be described in the following. FIGS. 11A to 11I are sectional views of the structure of the MIS FET with the high breakdown voltage shown in FIG. 8 in the steps of manufacturing the same and FIGS. 12A to 12H are sectional views of the structure shown in FIG. 9 in the manufacturing steps thereof.

First, referring to FIGS. 11A and 12A, an underlying oxide film 14 and a nitride film 15 are sequentially formed on the surface of the p type silicon substrate 13.

Then, a resist pattern 16 of a predetermined configuration is formed on the surface of the nitride film 15.

Referring to FIGS. 11B and 12B, the nitride film 15 is selectively removed into a predetermined configuration using the resist pattern 16 as a mask. Furthermore, a resist is again applied on the surface of the p type silicon substrate 13 and which is patterned into a predetermined configuration to form a resist pattern 17. Then, boron ion 24 is implanted into the surface of the p type silicon substrate 13 using the resist pattern 17 as a mask, thereby forming a p+ channel stopper 12.

Referring to FIGS. 11C and 12C, after the removal of the resist patterns 16 and 17, a resist is again applied to the surface of the p type silicon substrate 13 to form an additional resist pattern 18 by using photolithography. Then, phosphorus ion or arsenic ion 25 is implanted into the surface of the p type silicon substrate 13 using the resist pattern 18 and the nitride film 15 as masks. This ion implantation forms the n−− drain region 4 of the low concentration at a predetermined position of the surface of the p type silicon substrate 13.

Referring to FIGS. 11D and 12D, after the removal of the resist pattern 18 and the nitride film 15, a field oxide film 7 and a field isolation oxide film 23 are formed on a region of the surface of the p type silicon substrate 13 which is not covered with the nitride film 15 by using a thermal oxidation process. Thereafter, the nitride film 15 is removed. Through this process, the n−− drain region 4 is formed under the field oxide film 7 and the p+ channel stopper 12 is formed under the field isolation oxide film 23.

Referring to FIGS. 11E and 12E, the underlying oxide film 14 on the surface of the p type silicon substrate 13 is removed. Then, a gate insulation film 9 is formed on the surface of the p type silicon substrate 13 from which the underlying oxide film 14 is removed, by the thermal oxidation process. Furthermore, a polycrystalline silicon layer 2 is formed on the gate oxide film 9 by using CVD (Chemical Vapor Deposition). Then, a resist is applied on the major surface of the polycrystalline silicon layer 2 to form a resist pattern 19 of a predetermined configuration.

Referring to FIGS. 11F and 12F, the polycrystalline silicon layer 2 is selectively etched to be removed using the resist pattern 19 as a mask. Through this process, the gate electrode 2 is formed. Then, after the removal of the resist pattern 19, phosphorus ion 26 is implanted into the p type silicon substrate 13 using the gate electrode 2 as a mask. This ion implantation forms an n− source region 6 in a predetermined region of the surface of the p type silicon substrate 13 which will be a source region, and an n type impurity region of a low concentration is formed in a region which will be a drain region.

Referring to FIG. 11G, after the formation of the CVD oxide film on the surface of the silicon substrate 13, the CVD oxide film is anisotropically etched, thereby forming a gate sidewall 8 on a sidewall of the gate electrode 2. Furthermore, arsenic ion 27 is implanted into the surface of the p type silicon substrate 13 using the gate electrode 2 and the gate sidewall 8 as masks. This ion implantation forms an n+ drain region and an n+ source region 3.

Referring to FIGS. 11H and 12G, after the thermal process of the entire silicon substrate, an interlayer insulating film 10 is deposited on the surface of the silicon substrate using the CVD method. Then, the resist is applied on the surface, thereafter which is patterned into a predetermined configuration to form a resist pattern 20. Then, using the resist pattern 20 as a mask the interlayer insulating film 10 is selectively etched, thereby forming a contact hole 22.

Referring to FIGS. 11I and 12H, an aluminum-silicon layer 5 is formed on the surface of the interlayer insulating film 10 by a sputtering method. Furthermore, a resist pattern 21 of a predetermined configuration is formed on the surface of the aluminum-silicon layer 5.

Thereafter, the aluminum-silicon layer 5 is etched into a predetermined configuration to form an aluminum interconnection layer 5. Then, the whole surface is covered with a passivation film 11. The above described processes complete a manufacturing of the MIS FET with the high breakdown voltage.

One of the causes of a malfunction of a semiconductor device is surge breakdown phenomenon in which a high surge voltage caused by static electricity charged on an IC package incorporated in the above described MIS FET with the high breakdown voltage permanently breaks down a junction region of a transistor and the like. Accordingly, the above described MIS FET with the high breakdown voltage is required to have a predetermined withstanding amount (referred to as surge withstanding amount hereinafter) against the surge breakdown. An evaluation test of the surge withstanding amount of the conventional MIS FET with the high breakdown voltage is performed using a surge withstanding amount measuring device shown in FIG. 13. The shown surge withstanding amount measuring device is for testing a breakdown state of a sample transistor by storing a predetermined amount of electric charges from a direct current power supply in a condenser C, and thereafter switching a circuit and discharges the electric charges stored between a source and a drain of a sample MIS FET. As a result of the evaluation test of the device, the surge withstanding amount of the above described MIS FET with the high breakdown voltage is approximately 200 V in both of a positive bias and a negative bias, which is far lower than a target value of 300 V.

Model examples of the surge breakdown are as follows.

(1) Due to an inherentrly slow response of a transistor of this type to a surge voltage, a voltage applied to the circuit is instantaneously raised above a breakdown voltage, resulting in breakdown.

(2) Currents and electric fields are concentrated due to the surge voltage to break down a pn junction.

Regarding such models of the surge breakdown, the present invention is particularly directed to the resolution of the item (2). FIG. 9B is a partially enlarged view of FIG. 9A. FIG. 10 is an enlarged plan view of FIG. 7. Namely, referring to FIGS. 9A, 9B and 10, assuming that a surge voltage, a high voltage is applied to a drain of an MIS FET with the high breakdown voltage. In this case, a surge current flows from the drain region 1 to the silicon substrate 13 due to avalanche breakdown phenomenon. Then, this flow of the surge current prevents a pn junction between the drain region 1 and the silicon substrate 13 from being broken down. However, the N+ drain region 1 is surrounded by the n−− drain region 4. The n−− drain region 4 alleviates concentration of the electric field near the n+ drain region 1. FIG. 9B shows distribution of the electric field near the n+ drain region 1. The formation of the n−− drain region 4 causes the spacing between the electric field distribution curves 35 to be large and the gradient thereof to be gentle near the n+ drain region 1. As a result, the avalanche breakdown is less likely to occur, so that the surge current 32 is less likely to be flowed from the n+ drain region 1 to the substrate 13. In such a state, the electric field is concentrated at the part which is structurally discontinuous indicated by the arrow A in the drawing.

As the foregoing, in the conventional MIS FET with the high breakdown voltage, the existence of the n−− drain region 4 capable of improving the drain breakdown voltage prevents the increase of the surge withstanding amount.

Therefore, there is a need to provide an arrangement for more effectively dissipating a surge voltage consistent with retaining of high voltage breakdown properties of an MIS FET provided by the n−− region which prevents the increase of surge withstanding amount.

SUMMARY OF THE INVENTION

An object of the present invention is to increase a surge withstanding amount of an MIS FET with a high breakdown voltage.

Another object of the present invention is to improve current emission capability of a drain region for a surge voltage applied to the MIS FET with the high breakdown voltage.

A further object of the present invention is to increase a junction capacitance of the drain region of the MIS FET with the high breakdown voltage.

An MIS FET with a high breakdown voltage according to the present invention comprises a semiconductor substrate of a first conductivity type having a major surface, a gate electrode formed on the major surface of the semiconductor substrate on an insulation film, a first impurity region of a second conductivity type having a high concentration formed at the major surface of the semiconductor substrate and having an end portion approximately coincident with an end portion on one side of a gate length of the gate electrode, a second impurity region of the second conductivity type having a high concentration formed at the major surface of the semiconductor substrate and an end portion on the other side of the gate length of the gate electrode, and a third impurity region of the second conductivity type having a concentration of impurity lower than that of the second impurity region formed in connection with a part of peripheral portion of the second impurity region near the major surface of the semiconductor substrate. The second impurity region has a pn junction region of the semiconductor substrate and the second impurity region in a part of the peripheral portion near the major surface of the semiconductor substrate.

The MIS FET with the high breakdown voltage according to the present invention has the third impurity region having the relatively low concentration and the pn junction region formed directly in contact with the semiconductor substrate in the peripheral portion of the second impurity region which will be a drain region. This pn junction region allows a junction capacitance between the drain region and the semiconductor substrate to be increased. Then, in case a high surge voltage is externally applied to the drain region, as the junction capacitance between the drain region and the semiconductor substrate is increased, outflow of the surge current due to the avalanche breakdown is increased, thereby increasing a surge withstanding amount for the surge breakdown.

The method of manufacturing an insulated gate field effect transistor having a high breakdown voltage structure according to the present invention includes the following steps. First, a drain impurity region is formed in a predetermined area of a main surface of a semiconductor material. A portion of a peripheral portion of the drain region is masked. Then, a low impurity concentration region is formed at an unmasked portion of the peripheral portion of the drain region by implanting impurity ions.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 5A, 5B, 5B-1, 5C, 5D, 5E, 5F and 5G are sectional diagrams of the structure of the MIS FET shown in FIG. 3 showing sequential manufacturing step thereof.

FIGS. 11A, 11B, 11B-1, 11C, 11D, 11E, 11F, 11G, 11H and 11I are sectional diagrams of a structure of the MIS FET shown in FIG. 8 showing a sequential manufacturing step thereof.

DESCRIPTION OF THE PREFERRED EMBODIMENTS

Figure 1:
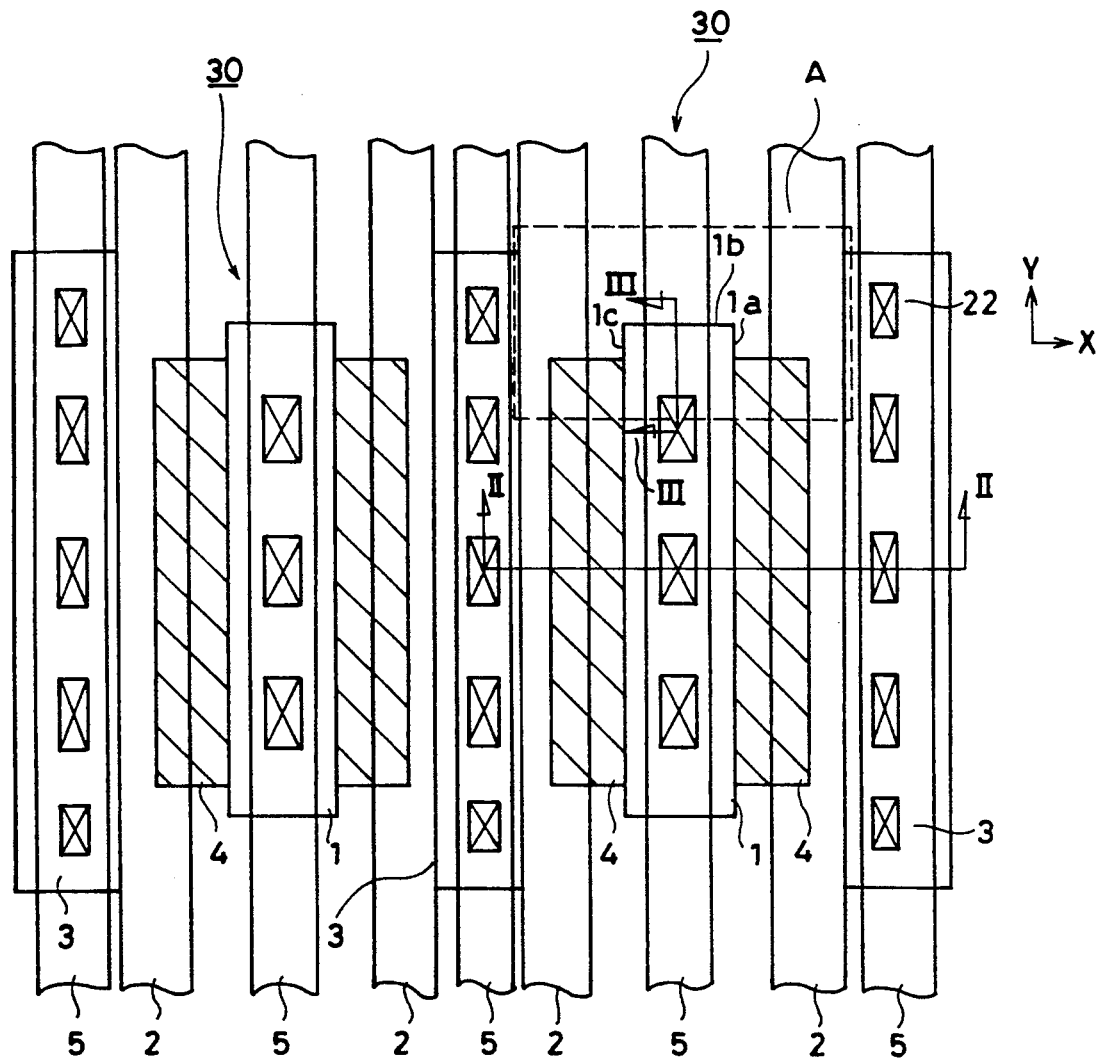
FIG. 1 is a diagram showing a plane structure of a semiconductor device comprising an MIS FET with a high breakdown voltage according to one embodiment of the present invention.
Figure 2:
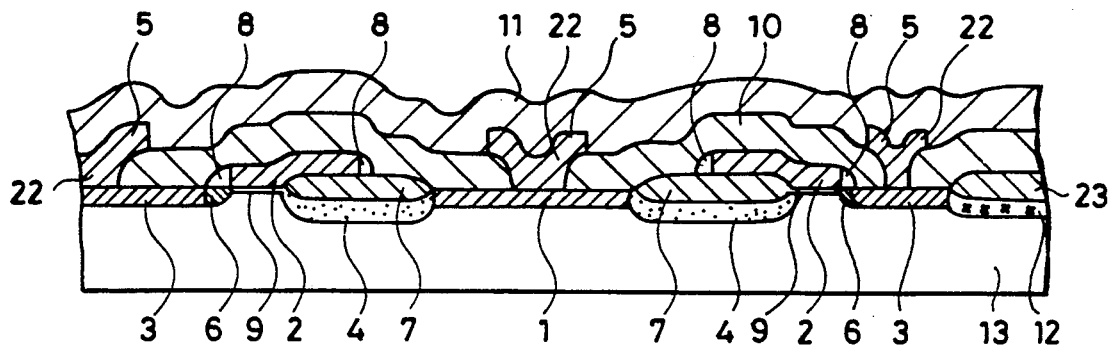
FIG. 2 is a diagram showing a sectional structure taken along a cut line II—II in FIG. 1.

FIGS. 1 and 2 show two MIS FETs with the high breakdown voltage 30, 30 arranged in parallel on a surface of the p type silicon substrate 13. The MIS FET with the high breakdown voltage 30 comprises a gate electrode 2 formed on the surface of the p type silicon substrate 13 on a thin gate insulation film 9, a pair of source regions 3 and 6 and a pair of drain regions 1 and 4. The source region is formed of an n+ source region 3 of a relatively high concentration and an n− source region 6 of a low concentration ($3 \times 10^{13}$/cm$^2$) connected to a channel side of the n+ source region 3. The drain region is formed of an n+ drain region 1 of a high concentration ($4 \times 10^{15}$/cm$^2$) and an n−− drain region 4 of a low concentration ($2.5 \times 10^{13}$/cm$^2$) connected to a peripheral portion of the n+ impurity region 1. Furthermore, a field oxide film 7 having a film thickness larger than that of the gate insulation film 9 is formed on a surface of the n−− drain region 4. The gate electrode 2 has a portion located on the field oxide film 7. A width of the field oxide film 7 is on the order of 5-10 μm. In the following description a width denotes a dimension in an X direction and a length denotes a dimension in a Y direction in FIG. 1. In addition, the gate electrodes 2 are spaced apart from the n+ drain region 1 by a predetermined distance to constitute an off-set gate structure. A gate sidewall 8 is formed on a sidewall of the gate electrode 2. In addition, aluminum interconnection layers 5, 5 are connected to the surfaces of the n+ drain region 1 and the n+ source region 3.

Now, the present invention, specifically a structure of the drain region will be described in the following. The n+ drain region 1 constituting the off-set gate structure is formed into a rectangular configuration having a width and a length on the order of 10-20 μm and 100 μm respectively on the major surface of the p type silicon substrate 13. The n−− drain region 4 is formed into a rectangular configuration along a longer side of the peripheral portion of the n+ drain region 1. The n−− drain region 4 is not formed near a shorter side of the n+ drain region 1, and which region constitutes a pn+ junction region 31 between the n+ drain region 4 and the p type silicon substrate 13.

Figure 3A:
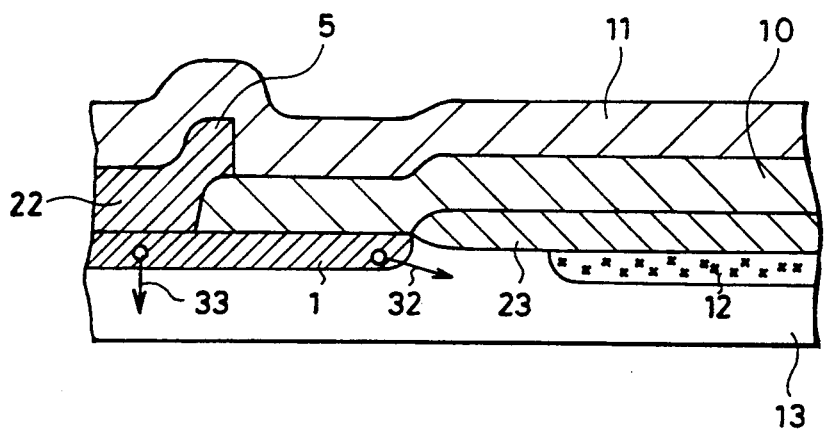
FIG. 3A is a diagram showing a sectional structure taken along a cut line III—III in FIG. 1.
Figure 3B:
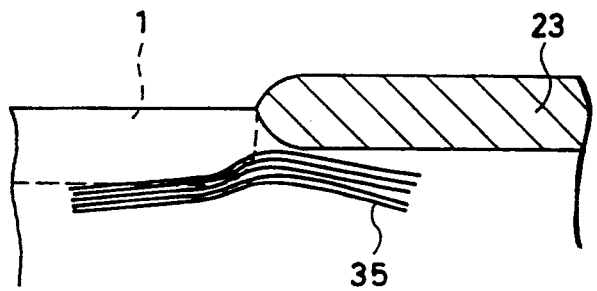
FIG. 3B is a partially enlarged view of FIG. 3A.
Figure 4:
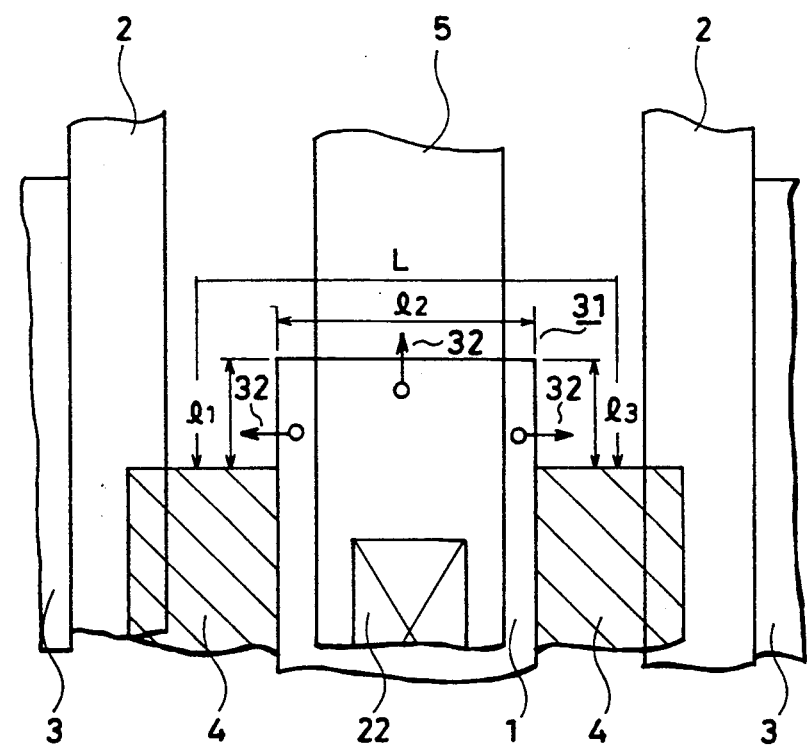
FIG. 4 is an enlarged diagram of a plane structure of a region indicated by A in FIG. 1.
Figure 6:
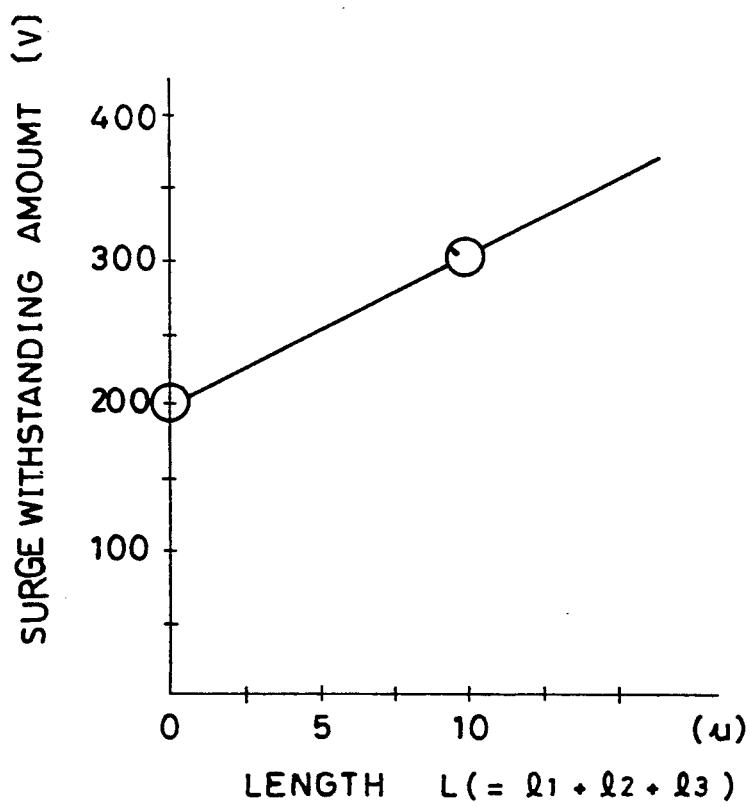
FIG. 6 is a diagram of evaluation of a surge withstanding amount indicating a result of an evaluation test of the surge withstanding amount of the MIS FET according to the present invention.
Figure 9A:
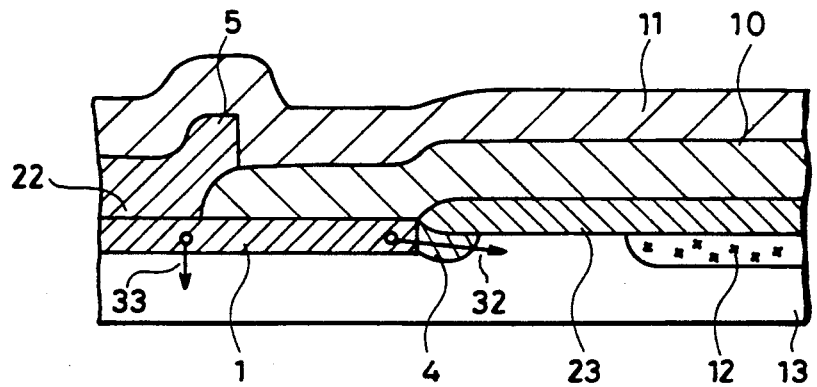
FIG. 9A is a diagram of a sectional structure taken along a cut line IX—IX in FIG. 7.
Figure 9B:
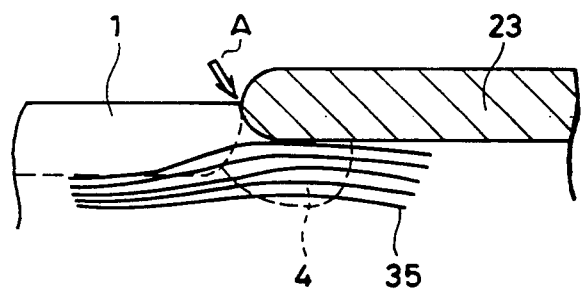
FIG. 9B is a partially enlarged view of FIG. 9A.
Figure 10:
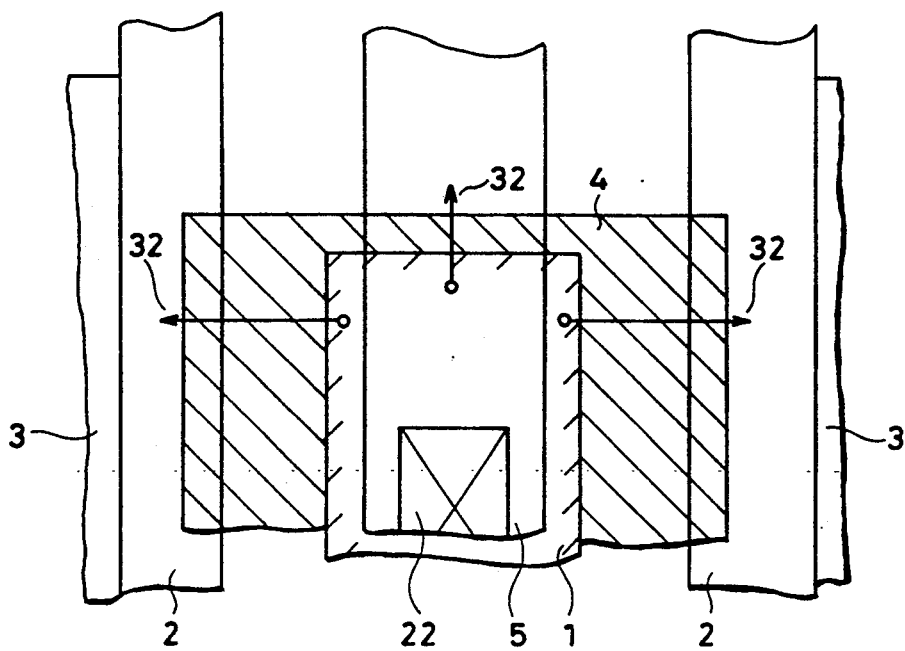
FIG. 10 is an enlarged diagram of a plane structure of a region indicated by B of FIG. 7.
Figure 13:
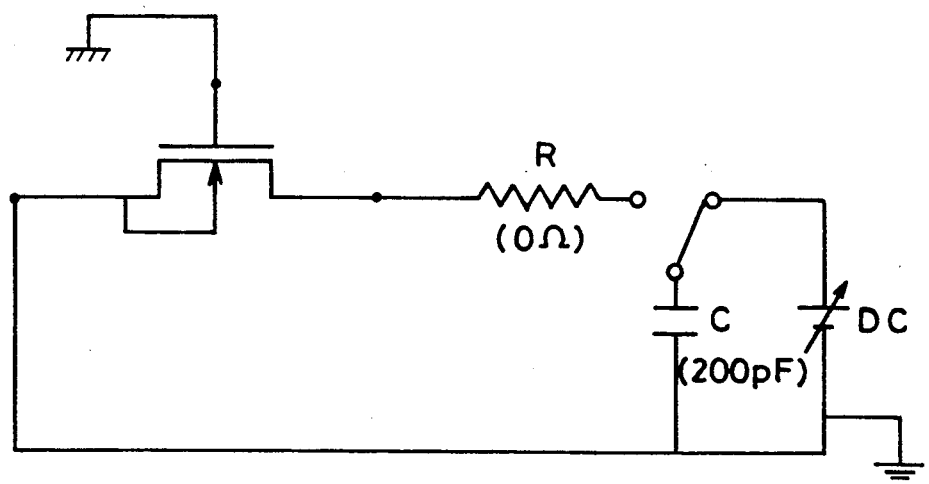
FIG. 13 is a circuit diagram of a surge withstanding amount evaluating device used for evaluating a surge withstanding amount of the MIS FET.

FIG. 4 is an enlarged plan view of a region indicated by A in FIG. 1. In the embodiment shown in the drawing, a total length $L_o$ of the four laterals of the n+ drain region 1 of a plane rectangular is 220-240 μm. In addition, the pn+ junction regions 31, 31 are formed longitudinally at the opposite sides of the n+ drain region 1 and a length L of one of the pn+ junction regions 31, 31 is not less than about 10 μm. Accordingly, a ratio $2L/L_o$ of the peripheral length $L_o$ of the n+ drain region 1 to lateral length 2L of the pn+ junction region 31 is desirably not less than about 1/12. The MIS FET with the high breakdown voltage thus constituted as the foregoing is tested using a surge withstanding amount evaluating device shown in FIG. 13. FIG. 6 shows the result with a distance L shown in a horizontal axis denoting a total length of $l_1$, $l_2$ and $l_3$ of the pn+ junction region 31 in FIG. 4. As shown in FIG. 6, the surge withstanding amount is increased in proportion to the distance L of the pn+ junction region 31. As an example, the surge withstanding amount reaches 300 V when the distance L is 10 μm. Arrows 32 and 33 in FIGS. 3A, 3B and 4 schematically show a surge current caused by the avalanche breakdown. Referring to FIG. 3B, in the MIS FET according to the present invention, the spacing between the electric field distribution curves 35 is narrow and the gradient thereof is sharp. Therefore, the avalanche breakdown is likely to occur between the n+ drain region 1 and the substrate 3. Accordingly, the surge current 32 is flowing out in the pn+ junction region 31 is increased as compared with the prior art shown in FIGS. 9A, 9B and 10. This is because there exists no n−− drain region 4 serving as a resistance for the pn+ junction region 31. While in the present embodiment, the pn+ junction region 31 is formed in the region near the shorter side of the n+ drain region 1 of the rectangular configuration, it is not limited thereto and may also be formed on any portion of the drain periphery including the longer side of the n+ drain region 1. Then, the length L of the pn+ junction region 31 is determined by the optimum combination of the drain breakdown voltage and the surge withstanding amount required for the MIS FET with the high breakdown voltage.

Figure 8:
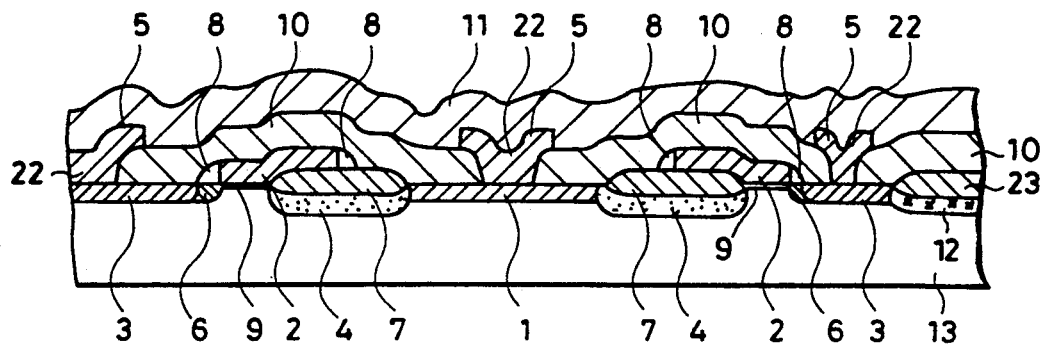
FIG. 8 is a diagram of a sectional structure taken along a cut line VIII—VIII in FIG. 7.

Now, manufacturing steps of the MIS FET with the high breakdown voltage according to the present embodiment will be described. The description will be given using FIGS. 11A through 11I referred in the description of the prior art for describing the sectional structure shown in FIG. 2 and the manufacturing steps of the sectional structure shown in FIG. 3 will be described using FIGS. 5A through 5G. Namely, in the manufacturing steps of the MIS FET according to the present embodiment, the sectional structure shown in FIG. 2 and a conventional sectional structure shown in FIG. 8 have the same configuration.

Figures 1, 11C:
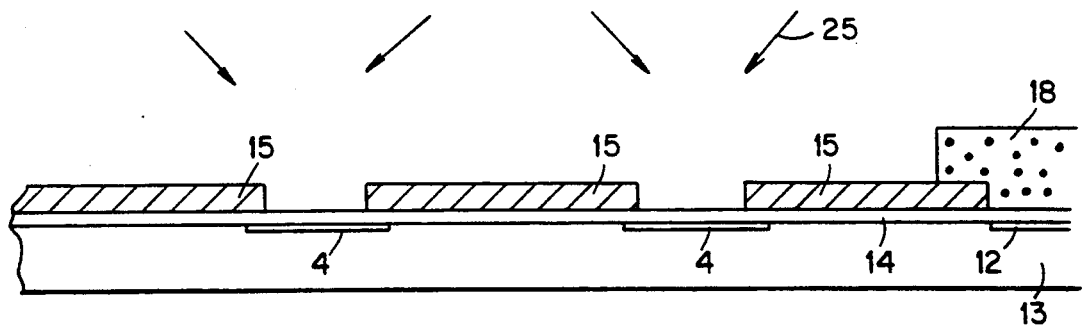
Figure 7:
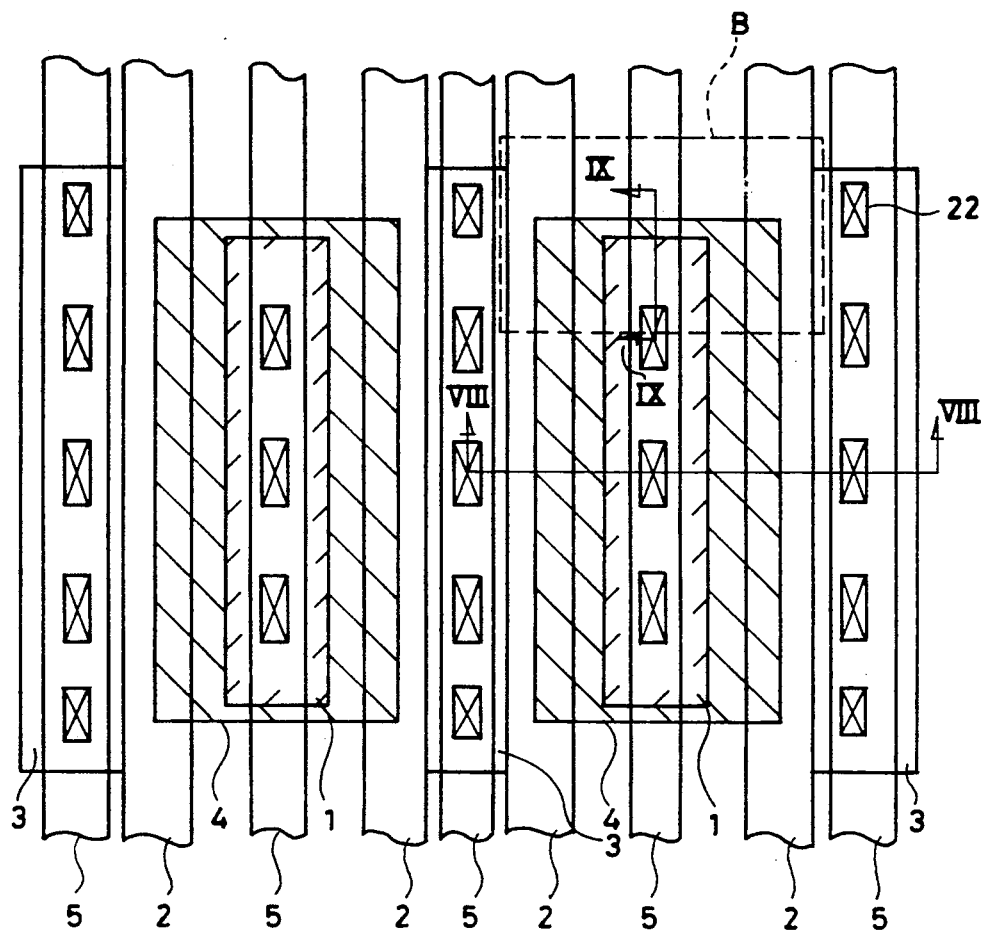
FIG. 7 is a diagram of a plane structure of a semiconductor device comprising a conventional MIS FET with the high breakdown voltage.
Figure 11A:
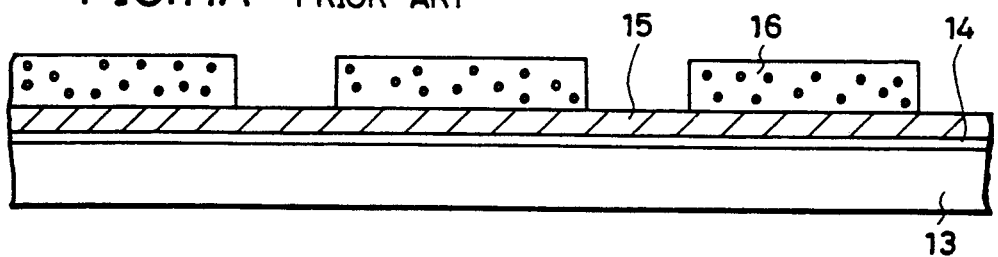

First, referring to FIG. 11A, an underlying oxide film 14 is formed on the major surface of the p type silicon substrate 13 by a thermal oxidation method. Furthermore, a nitride film 15 is formed on the major surface of the underlying oxide film 14 by the CVD method. Then, a resist pattern 16 of a predetermined configuration is formed on the surface of the nitride film 15 by using the photolithography.

Figure 11B:
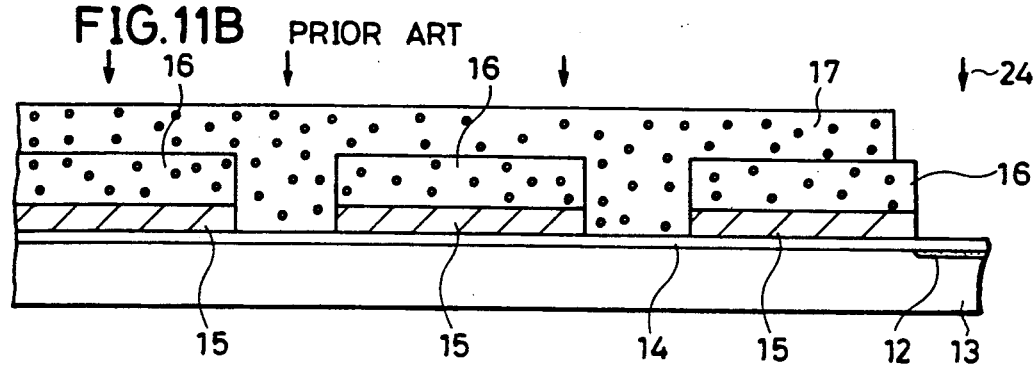
Figure 11C:
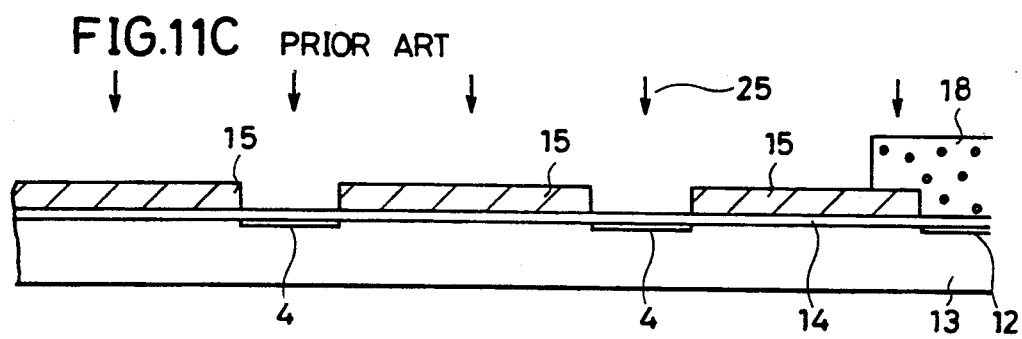

Referring to FIGS. 11B and 5A, the nitride film 15 is etched into a predetermined configuration using the resist pattern 16 as a mask, and furthermore, an additional resist pattern 17 is formed on the major surface thereof. Then, boron ion 24 is implanted into the major surface of the p type silicon substrate 13 using the resist pattern 17 as a mask. This ion implantation forms a p+ channel stopper 12 on the surface of the p type silicon substrate 13.

Figure 5G:
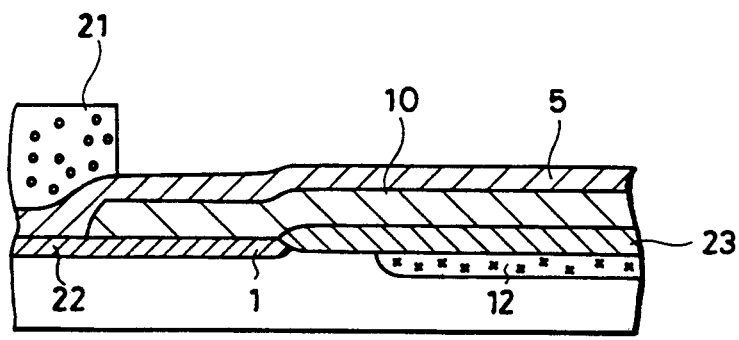
Figures 1, 5B:
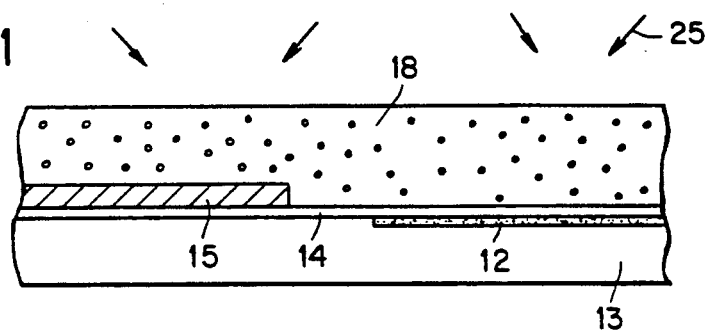

Referring to FIGS. 11C, 11C-1, 5B and 5B-1, after the removal of the resist patterns 17 and 16, a resist pattern 18 of a predetermined configuration is again formed. Then, phosphorus ion or arsenic ion 25 is implanted into the surface of the p type silicon substrate using the resist pattern 18 and the nitride film 15 as masks, thereby forming an n−− drain region 4 of a low concentration on the surface of the p type silicon substrate 13. In this step, arsenic ions are implanted into the silicon substrate by the diagonal and rotational ion implantation method (FIGS. 11C-1 and 5B-1), and the phosphorus ions are implanted by the vertical ion implantation method (FIGS. 11C and 5B).

Figure 11D:
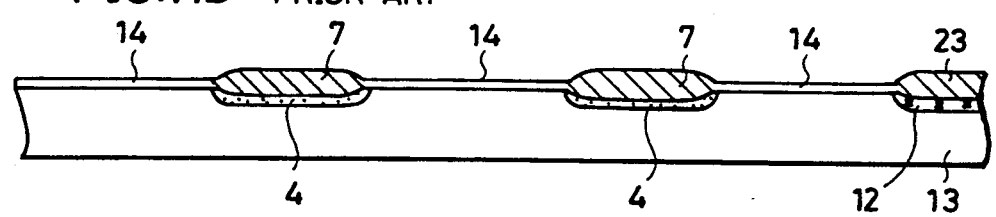

Thereafter, referring to FIGS. 11D and 5C, after the removal of the resist pattern 18 a thermal oxidation process is applied using the nitride film 15 as a mask to form a field oxide film 7 and a field isolation oxide film 23 in a predetermined region on the surface of the p type silicon substrate 13. The field oxide film 7 is formed on the surface of the n−− impurity region 4 and the field isolation oxide film 23 is formed on the surface of the channel stopper 12.

Figure 11E:
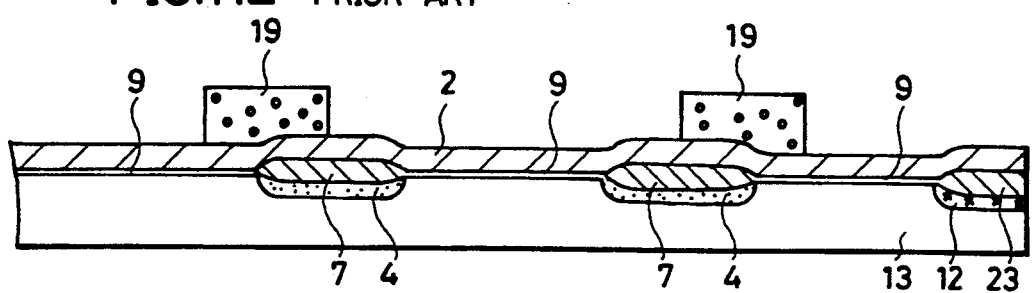

Referring to FIGS. 11E and 5D, the underlying oxide film 14 is removed. Furthermore, a thin gate insulation film 9 is formed on a part of the surface of the p type silicon substrate 13 from which the underlying oxide film 14 is removed by using the thermal oxidation method. Then a polycrystalline silicon layer 2 is deposited by using the CVD method. A resist pattern 19 of a predetermined configuration is formed on the surface of the polycrystalline silicon layer 2.

Figure 11F:
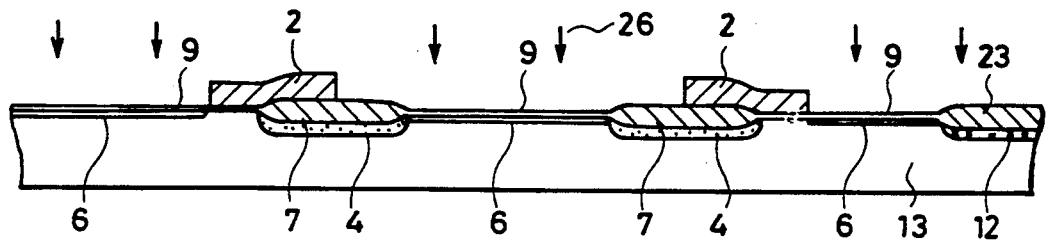

Referring to FIG. 11F, the polycrystalline silicon layer 2 is patterned into a predetermined configuration using the resist pattern 19 as a mask to form a gate electrode 2. Then a small dose amount of the phosphorus ion 26 is implanted into the surface of the p type silicon substrate 13 using the gate electrode 2 or the like as a mask, thereby forming an n− source region 6 of the low concentration in the source region and further forming an n type impurity region in the drain region.

Figure 11G:
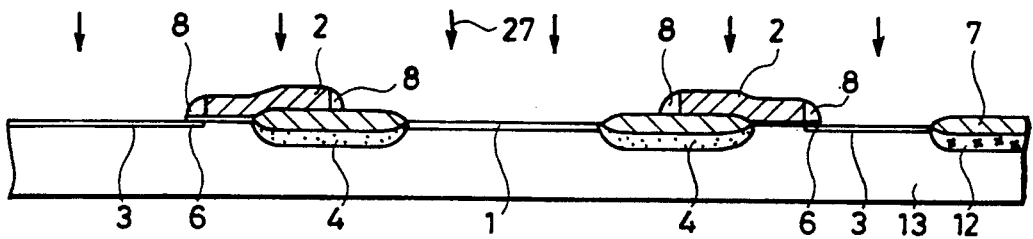

Referring to FIG. 11G and FIG. 5E, a silicon oxide film is deposited on the surface of the silicon substrate 13 using the CVD method, and which is selectively removed by the anisotropic etching, thereby forming a gate sidewall 8 on the sidewall of the gate electrode 2. Then, arsenic ion 27 is implanted into the surface of the p type silicon substrate 13 using the gate electrode on which the gate sidewall 8 is formed as a mask. This ion implantation forms an n+ source region 3 of the high concentration in the source region and an n+ drain region 1 of the high concentration in the drain region.

Figure 11H:
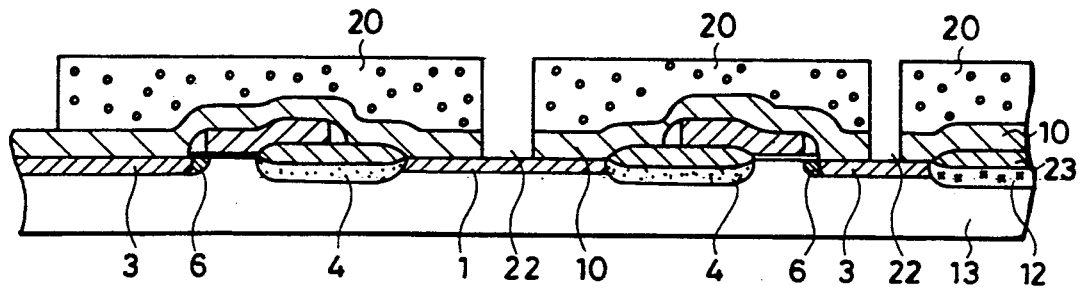

Referring to FIG. 11H and FIG. 5F, an interlayer insulating film 10 is deposited over the p type silicon substrate 13. Then, after the application of the resist on the surface of the interlayer insulating film 10, which is formed into a predetermined configuration. The interlayer insulating film 10 is selectively etched using the patterned resist pattern 20 as a mask to form a contact hole 22.

Figure 11I:
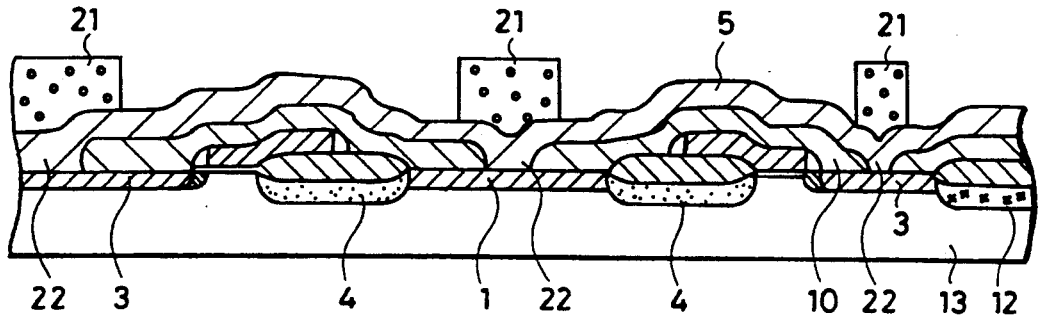
Figure 12A:
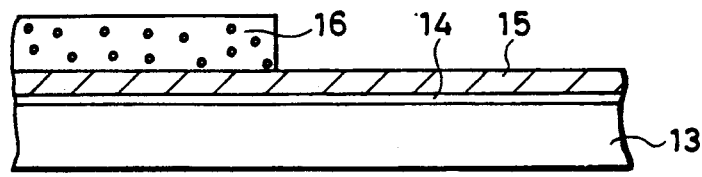
FIGS. 12A, 12B, 12C, 12D, 12E, 12F, 12G and 12H are sectional diagrams of the structure shown in FIG. 9. showing a sequential manufacturing step thereof.
Figure 12B:
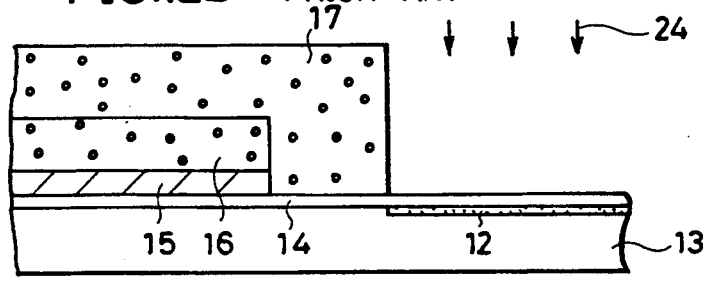
Figure 12C:
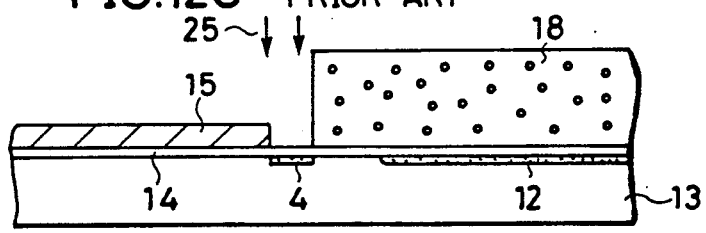
Figure 12D:
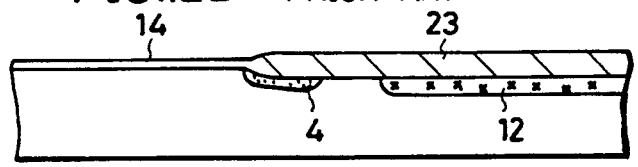
Figure 12E:
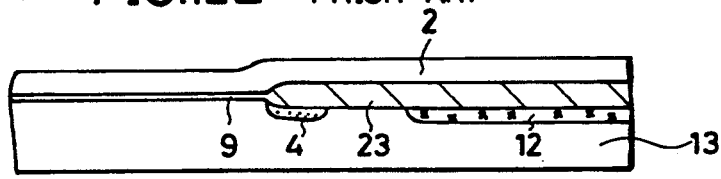
Figure 12F:
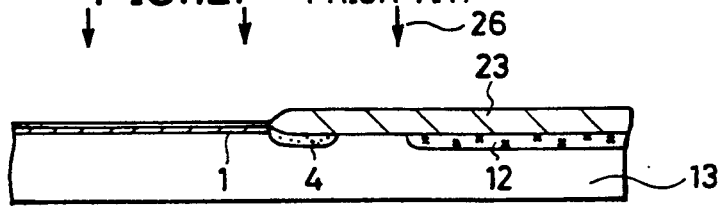
Figure 12G:
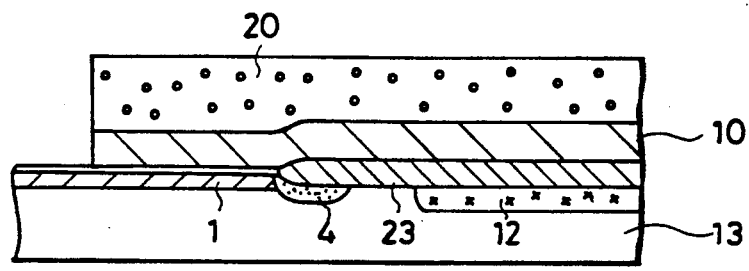
Figure 12H:
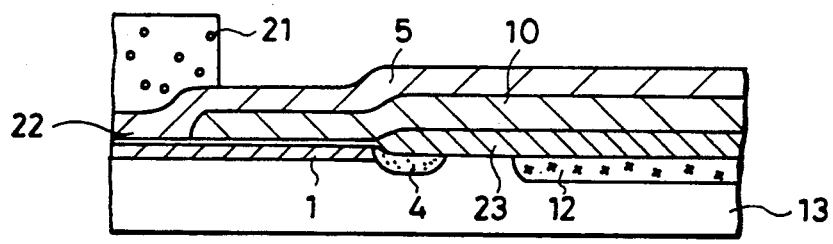

Referring to FIGS. 11I and 5G, an aluminum-silicon layer 5 is formed on the surface of the interlayer insulating film 10 and in the contact hole 22 by using the sputtering method. Then a resist pattern 21 of a predetermined configuration is formed on the surface of the aluminum-silicon layer 5.

Thereafter, the aluminum-silicon layer is patterned into a predetermined configuration using the resist pattern 21 as a mask to form an aluminum interconnection layer 5. Then, the entire surface of the silicon substrate is covered with a passivation film 11. The above described steps complete a manufacturing process.

In the above described manufacturing steps, the feature of the present invention is ion implantation processing shown in FIG. 5B. More specifically, in implanting the ion to form the n−− drain region 4 of the drain region, the resist pattern is formed so as to cover a region in which the pn+ junction region 31 is to be formed with the resist pattern 18. Accordingly, the pn+ junction region 31 can be determined to have an arbitrary configuration in accordance with the configuration of the resist pattern.

While in the above described embodiments, description is given to a case in which the gate electrode 2 is a polycrystalline silicon layer, a gate electrode may be formed of, for example, a high melting point metal such as molybdenum and tungsten or the silicide thereof. In addition, an aluminum interconnection layer connected to the source and drain regions may be formed of a multi-layered metal interconnection.

While in the above described embodiments, description is given to the n channel transistor, it is applicable to a p channel transistor.

As the foregoing, the MIS FET with the high breakdown voltage according to the present invention is formed to have an impurity region of a low concentration by which a drain breakdown voltage due to alleviation of the electric field can be increased in a peripheral portion of a drain region of a high concentration and an pn junction region by which a junction capacitance between the drain region and a semiconductor substrate can be increased, so that a semiconductor device with a high breakdown voltage having an improved surge withstanding amount can be implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An MIS FET with a high breakdown voltage comprising:
    a semiconductor substrate of a first conductivity type having a major surface,
    a gate electrode formed on the major surface of said semiconductor substrate with an insulation film provided therebetween, said gate electrode having a gate length defined by opposite ends thereof,
    a first impurity region of a second conductivity type formed on the major surface of said semiconductor substrate having upper and lower boundary regions parallel to said major surface of said substrate, and a peripheral boundary region laterally circumscribing said first impurity region between said upper and lower boundary regions, wherein said peripheral boundary region is displaced from one of said opposite ends of said gate electrode in the direction of the gate length of said gate electrode,
    a second impurity region of the second conductivity type formed on the major surface of said semiconductor substrate having upper and lower boundary regions parallel to said major surface of said substrate, and a peripheral boundary region laterally circumscribing said second impurity region between said upper and lower boundary regions, said peripheral boundary region having a first portion and a second portion, wherein said first portion and said second portion are displaced from the other of said opposite ends of said gate electrode in the direction of the gate length of said gate electrode,
    a third impurity region of the second conductivity type having a concentration of impurity lower than that of said second impurity region formed in only lateral contact with said second impurity region at only said first portion of said peripheral boundary region near the major surface of said semiconductor substrate,
    said second impurity region having a pn junction region formed between said semiconductor substrate and said second portion of said peripheral boundary region of said second impurity region.

2. An MIS FET with a high breakdown voltage according to claim 1, wherein said third impurity region is formed only on a channel region side of the peripheral portion of said second impurity region.

3. An MIS FET with a high breakdown voltage according to claim 1, wherein said gate insulation film comprises a first portion having a relatively thin film thickness, and
    a second portion having a relatively large film thickness,
    said third impurity region is formed at least directly under the second portion of said gate insulation film.

4. An MIS FET with a high breakdown voltage according to claim 1, wherein,
    said second impurity region has a rectangular configuration in the major surface of said semiconductor substrate,
    said third impurity region is formed along a pair of longer sides of said second impurity region of the rectangular configuration.

5. An MIS FET with a high breakdown voltage and high surge withstand capability comprising:
    a body of semiconductor material of a first conductivity type having a major surface,
    a first impurity region of a second conductivity type having a predetermined impurity concentration formed on said major surface of said body of semiconductor material, said first impurity region having upper and lower boundary regions parallel to said major surface, and a peripheral boundary region laterally circumscribing said first impurity region between said upper and lower boundary regions, and
    a second impurity region of said second conductivity type having an impurity concentration which is substantially lower than said first impurity region by an amount sufficient to raise the breakdown voltage of said MIS FET and having upper and lower boundary regions parallel to said major surface, and a peripheral boundary region laterally circumscribing said second impurity region between said upper and lower boundary regions, said peripheral boundary region having a first portion and a second portion, said first portion formed in connection with only said peripheral boundary region of said first impurity region near said surface of said body of semiconductor material, and said second portion formed in connection with only said body of semiconductor material.

6. An MIS FET with a high breakdown voltage and high surge withstand capability comprising:
    a body of semiconductor material of a first conductivity type having a major surface,
    a first impurity region of a second conductivity type having a predetermined impurity concentration formed on said major surface of said body of semiconductor material, said first, impurity region having upper and lower boundary regions parallel to said major surface, and a peripheral boundary region laterally circumscribing said first impurity region between said upper and lower boundary regions,
    a second impurity region of said second conductivity type having an impurity concentration which is lower than said first impurity region and having upper and lower boundary regions parallel to said major surface, and a peripheral boundary region laterally circumscribing said second impurity region between said upper and lower boundary regions, said peripheral boundary region having a first portion and a second portion, said first portion formed in contact with only said peripheral boundary region of said first impurity region near said surface of said body of semiconductor material, and said second portion formed in contact with only said body of semiconductor material, and an oxide film of greater thickness than a gate insulator formed on said second impurity region.

7. An MIS FET with a high breakdown voltage and high surge withstand capability comprising:

a body of semiconductor material of a first conductivity type having a major surface, a first impurity region of a second impurity type having a predetermined impurity concentration formed on said major surface of said body of semiconductor material, said first impurity region having upper and lower boundary regions parallel to said major surface, and a peripheral boundary region laterally circumscribing said first impurity region between said upper and lower boundary regions, and a high breakdown voltage structure including a second impurity region of said second conductivity type having an impurity concentration which is lower than said first impurity region and having upper and lower boundary regions parallel to said major surface, and a peripheral boundary region laterally circumscribing said second impurity region between said upper and lower boundary regions, said peripheral boundary region having a first portion and a second portion, said first portion formed in connection with only said peripheral boundary region of said first impurity region near said surface of said body of semiconductor material, and said second portion formed in connection with only said body of semiconductor material.

* * * * *